(12) United States Patent
Palm (10) Patent No.: US 11,791,255 B2
(45) Date of Patent: *Oct. 17, 2023

(54) DIE PACKAGE AND METHOD OF FORMING A DIE PACKAGE

(71) Applicant: Infineon Technologies AG, Neubiberg (DE)

(72) Inventor: Petteri Palm, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 17/849,788

(22) Filed: Jun. 27, 2022

(65) Prior Publication Data

US 2022/0399262 A1 Dec. 15, 2022

Related U.S. Application Data

(63) Continuation of application No. 16/787,146, filed on Feb. 11, 2020, now Pat. No. 11,373,944.

(30) Foreign Application Priority Data

Feb. 11, 2019 (DE) ..................... 10 2019 103 281.4

(51) Int. Cl.
*H01L 23/498* (2006.01)
*H01L 23/00* (2006.01)
(Continued)

(52) U.S. Cl.
CPC .... *H01L 23/49844* (2013.01); *H01L 21/4853* (2013.01); *H01L 21/6835* (2013.01);
(Continued)

(58) Field of Classification Search
CPC ........... H01L 23/49844; H01L 21/4853; H01L 21/6835; H01L 24/04; H01L 24/05;
(Continued)

(56) References Cited

U.S. PATENT DOCUMENTS 7,605,451 B2  10/2009 Moline
7,759,163 B2* 7/2010 Kroeninger ........... H01L 25/072
257/690

(Continued)

FOREIGN PATENT DOCUMENTS

| CN | 101572239 | 11/2009 |
| CN | 105849901 | 8/2016 |
| CN | 106057749 | 10/2016 |

OTHER PUBLICATIONS

Non-Final Office Action dated Mar. 4, 2021 in U.S. Appl. No. 16/787,146.

(Continued)

*Primary Examiner* — Vu A Vu (74) *Attorney, Agent, or Firm* — Dicke, Billig & Czaja, PLLC (57) ABSTRACT

A die package and method is disclosed. In one example, the die package includes a die having a first die contact on a first side and a second die contact on a second side opposite the first side, and insulating material laterally adjacent to the die. A metal structure substantially directly contacts the surface of the second die contact, wherein the metal structure is made of the same material as the second die contact. A first pad contact on the first side of the die electrically contacts the first die contact, and a second pad contact on the first side of the die electrically contacts the second die contact via the metal structure. The insulating material electrically insulates the metal structure from the first die contact.

24 Claims, 4 Drawing Sheets

(51) Int. Cl.
  *H01L 21/48* (2006.01)
  *H01L 21/683* (2006.01)
(52) U.S. Cl.
  CPC .............. *H01L 24/04* (2013.01); *H01L 24/05* (2013.01); *H01L 24/19* (2013.01); *H01L 24/20* (2013.01); *H01L 24/96* (2013.01); *H01L 2221/68359* (2013.01); *H01L 2221/68372* (2013.01); *H01L 2224/05624* (2013.01); *H01L 2224/05647* (2013.01); *H01L 2224/05655* (2013.01); *H01L 2224/211* (2013.01); *H01L 2224/214* (2013.01); *H01L 2924/1203* (2013.01); *H01L 2924/1304* (2013.01)
(58) Field of Classification Search
  CPC ......... H01L 24/19; H01L 24/20; H01L 24/96; H01L 2221/68359; H01L 2221/68372; H01L 2224/05624; H01L 2224/05647; H01L 2224/05655; H01L 2224/211; H01L 2224/214; H01L 2924/1203; H01L 2924/1304
  USPC ........................................................ 257/668
  See application file for complete search history.

(56) References Cited

U.S. PATENT DOCUMENTS

| | | | | |
|---|---|---|---|---|
| 7,799,614 B2* | 9/2010 | Otremba | .................. | H01L 24/82 |
| | | | | 361/767 |
| 8,507,320 B2* | 8/2013 | Otremba | ........... | H01L 23/49827 |
| | | | | 257/774 |
| 8,698,298 B2* | 4/2014 | Henrik | ................... | H01L 24/32 |
| | | | | 361/783 |
| 8,785,953 B2 | 7/2014 | Kim | | |
| 8,916,968 B2* | 12/2014 | Mahler | ............ | H01L 21/76877 |
| | | | | 257/691 |
| 8,952,545 B2 | 2/2015 | Otremba | | |
| 9,455,160 B2* | 9/2016 | Porwol | ................. | H01L 21/568 |
| 9,589,929 B2 | 3/2017 | Terrill | | |
| 9,837,382 B2* | 12/2017 | Watanabe | ............... | H01L 24/19 |
| 10,354,971 B2 | 7/2019 | Azdasht et al. | | |
| 11,058,009 B2* | 7/2021 | Mok | .................... | H05K 3/0026 |
| 11,373,944 B2* | 6/2022 | Palm | .................... | H01L 21/6835 |
| 2008/0171172 A1 | 7/2008 | Bae et al. | | |
| 2009/0160046 A1 | 6/2009 | Otremba et al. | | |
| 2009/0236749 A1 | 9/2009 | Otremba et al. | | |
| 2011/0176246 A1 | 7/2011 | Kim et al. | | |
| 2011/0240354 A1 | 10/2011 | Furuhata et al. | | |
| 2013/0241040 A1 | 9/2013 | Tojo et al. | | |
| 2014/0151100 A1 | 6/2014 | Yu et al. | | |
| 2015/0055309 A1 | 2/2015 | Bae et al. | | |
| 2017/0103939 A1 | 4/2017 | Gulpen et al. | | |
| 2019/0164865 A1 | 5/2019 | Elger | | |
| 2019/0380234 A1* | 12/2019 | Grober | ................... | H01L 23/13 |
| 2020/0161274 A1 | 5/2020 | Lee | | |
| 2020/0258830 A1 | 8/2020 | Palm | | |

OTHER PUBLICATIONS

Final Office Action dated May 28, 2021 in U.S. Appl. No. 16/787,146.
Non-Final Office Action dated Nov. 12, 2021 in U.S. Appl. No. 16/787,146.
Notice of Allowance dated Feb. 25, 2022 in U.S. Appl. No. 16/787,146.

* cited by examiner

DIE PACKAGE AND METHOD OF FORMING A DIE PACKAGE

CROSS-REFERENCE TO RELATED APPLICATION

The present application is a continuation application of U.S. patent application Ser. No. 16/787,146, filed Feb. 11, 2020, now U.S. Pat. No. 11,373,944 and claims priority to German Patent Application No. 10 2019 103 281.4, filed Feb. 11, 2019, which is incorporated herein by reference.

TECHNICAL FIELD

Various embodiments relate generally to a die package and to a method of forming a die package.

BACKGROUND

Cost and performance may be considered the two most relevant aspects regarding discrete power packages. It is a typical challenge in a production of embedded chips how to manufacture a package that has the best possible electrical and thermal performance at the lowest possible cost. A good electrical performance may require a good electrically conductive contact between the die and the package. Such contacts are typically formed as expensive laser micro-vias and/or plated through holes. A layout of a current CE 2nd generation 3×3 package may for example include two layers on both sides of the die. Due to this, the thermal performance may not be very good, and especially the manufacturing cost may be high.

A current successor to the Blade 3×3 package may have a total of four layers and a high number of plated micro-vias and through holes. The die may be located on a center line of the package, and a connection between both sides of the die and the outer layers may be provided by plated micro-vias, and due to this, the die back side may not be directly exposed to the package top side. Limitations of the current package may be a poor thermal performance and very high cost.

SUMMARY

A die package is provided. The die package may include a die having a first die contact on a first side of the die and a second die contact on a second side of the die opposite the first side of the die, insulating material laterally adjacent to the die, a metal structure substantially directly contacting the entire surface of the second die contact of the die, wherein the metal structure is made of the same material as the second die contact, a first pad contact on the first side of the die electrically contacting the first die contact, and a second pad contact on the first side of the die electrically contacting the second die contact via the metal structure, wherein the insulating material electrically insulates the metal structure from the first die contact.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1, including

FIG. 2, including

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In various embodiments, a method of forming a die package is provided that has a process flow that is simplified and very low cost compared to the existing one. The method allows skipping an expensive laser drilling process by using (e.g.) a plasma etching process and/or a water blasting process for forming one or more large area opening(s) to a front side of a (semiconductor) die (also referred to as (semiconductor) chip). A backside of the die opposite the front side of the die may be opened directly to a top side of the die package to guarantee the best possible (i.e. as low as possible) thermal resistance $R_{TH}$ to the top.

In various embodiments, a simple non-symmetric laminate based die package is provided. The die package may include only one routing layer, and the die backside may be directly connected to the package top side.

Figure 1A:
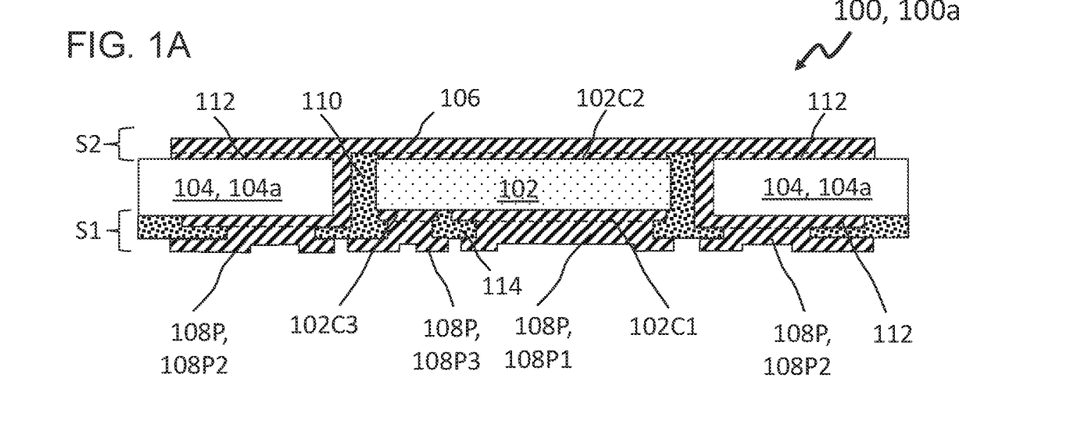
FIGS. 1A, 1B and 1C, illustrates schematic cross sections of three die packages in accordance with various embodiments.
Figure 1B:
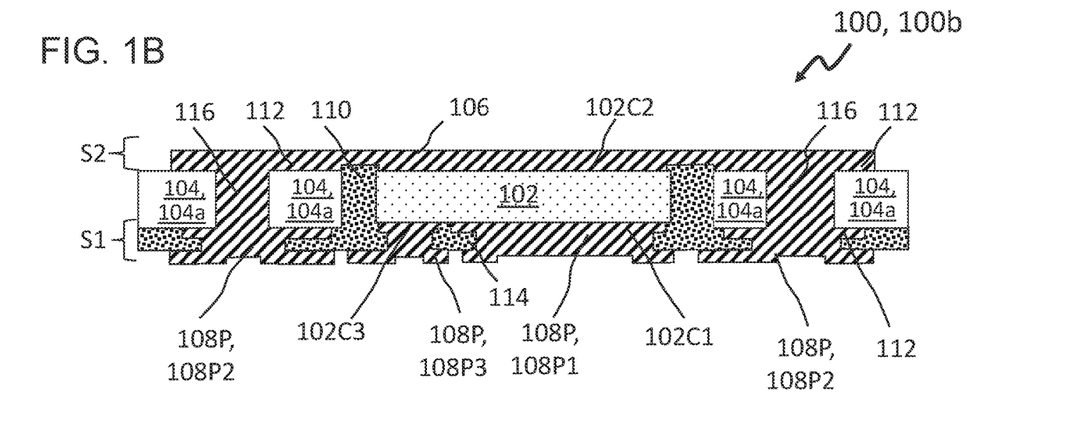
Figure 1C:
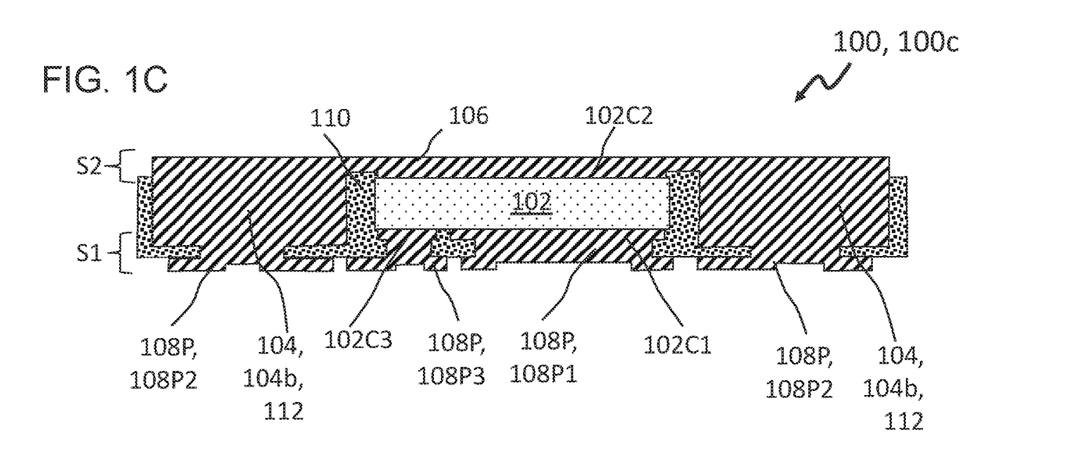

FIG. 1 (including FIGS. 1A, 1B and 1C) shows schematic cross sections of three die packages 100 (for easy reference distinguished as 100a, 100b, and 100c) in accordance with various embodiments. FIG. 2 (including FIGS. 2A, 2B, 2C, 2D, 2E, 2F and 2G) shows a visualization of a process 200 of forming a die package in accordance with various embodiments. FIG. 3 shows a flow diagram 300 of a method of forming a die package in accordance with various embodiments.

As shown in FIG. 1, each of the die packages 100 (100a, 100b, 100c) may include a die 102, e.g. a semiconductor die, e.g. a silicon die. The die 102 may have a first die contact 102C1 on a first side S1 of the die 102, and a second die contact 102C2 on a second side S2 of the die 102 opposite the first side S1 of the die 102.

The die 102 may for example form a diode, e.g. a power diode. In that case, the first die contact 102C1 may be an anode of the diode, and the second die contact 102C2 may be a cathode of the diode, or vice versa.

In various embodiments, for example in a case of the die 102 forming a transistor, e.g. a power transistor, the die 102 may further include a third die contact 102C3 on the first side S1 of the die 102. The third die contact 102C3 may for example be a controlling terminal of the transistor; and the first die contact 102C1 and the second die contact 102C2 may be controlled terminals of the transistor.

The first die contact 102C1, the second die contact 102C2, and, if present, the third die contact, may be made of same material.

In various embodiments, the die package 100 may be a power semiconductor device.

The die package 100 may further include insulating material 110 laterally adjacent to the die 102. The insulating material 110 may be arranged laterally adjacent to the semiconductor die, and also laterally adjacent to the first die contact 102C1, to the second die contact 102C2, and, if present, to the third die contact 102C3. The insulating material 110 may for example include or consist of an epoxy resin, with our without (e.g. anorganic) filler particles or reinforcement, or include or consist of other suitable insulating material.

The insulating material 110 may in various embodiments be arranged in the die package 100 as a foil, e.g. a resin foil (e.g. Ajinomoto Build-up Film (ABF) or similar resin foil, e.g. as used in PCB and substrate industry, for example a foil with or without filler particles (e.g. provided by Hitachi etc.) that may be laminated over and around the die 102. In various embodiments, the insulating material, e.g. the resin, may be printed, molded, etc.

In a case of the third die contact 102C3 being present, further insulating material 114 may be arranged between the first die contact 102C1 and the third die contact 102C3 electrically insulating the first die contact 102C1 and the third die contact 102C3 from each other. In various embodiments, a material of the insulating material 110 and of the further insulating material 114 may be identical or similar. In various embodiments, the insulating material 110 and the further insulating material 110 may be arranged in a common process, e.g. as described below.

The die package 100 may further include a metal structure 106 substantially directly contacting the entire surface (e.g. the entire top surface that is facing away from the semiconductor material of the die) of the second die contact 102C2 of the die 102. As an alternative way of putting it, the metal structure 106 may substantially directly contact the surface of the second die contact 102 of the die 102, and the surface of the second die contact 102C2 may be free from insulating material.

The metal structure 106 may be made of the same material as the second die contact 102C2. The material of the metal structure 106 and of the second die contact 102C2 may for example include or consist of copper, an aluminum-copper-alloy, a nickel-copper-alloy, or copper plated aluminum. In the cross-sectional schematic view of FIG. 1 showing the die package 100a, a dashed line indicates a contact region between the second die contact 102C2 and the metal structure 106. In the die packages 100b and 100c, this line is not added, but the contact region would be in a similar location.

In various embodiments, a homogeneous combined structure may be formed, in which the second die contact 102C2 and the metal structure 106 have the same coefficient of thermal expansion (CTE), such that the connection between the second die contact 102C2 and the metal structure 106 has a high robustness with respect to temperature changes, e.g. thermal cycling. Furthermore, by directly contacting the entire surface of the second die contact 102C2 with the metal structure 106, a thermal resistance $R_{TH}$ between the second die contact 102C2 and air (or, e.g., a cooling fluid, cooling structure and/or cooling device, which may be provided at an outer surface (i.e., opposite the die) of the metal structure 106) may be low. Details on how the metal structure 106 is formed are provided further below in context with FIG. 2.

In various embodiments, the die package 100 may include pad contacts 108P for contacting the die 102 from outside the die package 102. The die package 100 may for example include, on the first side S1 of the die, a first pad contact 108P1, which may electrically contact the first die contact 102C1. This means that the first pad contact 108P1 may be on the same side of the die 102 as the first die contact 102C1.

The die package 100 may further include a second pad contact 108P2 electrically contacting the second die contact 102C2 via the metal structure 106. The second pad contact 108P2 may also be arranged on the first side S1 of the die 102.

Optionally, e.g. in a case of the die package 100 forming a transistor, the die package 100 may further include a third pad contact 108P3 electrically contacting the third die contact 108C3. The third pad contact 108P3 may be arranged on the first side S1 of the die 102.

This means that all pad contacts 108P may be arranged on the same (first) side S1 of the die 102. The pad contacts 108 (108P1, 108P2, 108P3) may all be arranged on the same main surface of the die package 100, which may also be referred to as a front surface of the die package 100.

In various embodiments, the third die contact 102C3 and the third contact pad 108P3 may be made of same material as the second die contact 102C2 and the metal structure 106.

In various embodiments, the insulating material 110 may electrically insulate the metal structure 106 from the first die contact 102C1. If the third die contact 102C3 is present, the insulating material 110 may insulate the third die contact 102C3 from the metal structure 106.

In various embodiments, the die package 100 may optionally further include a carrier 104 laterally surrounding the die 102. Even though FIG. 1 and FIG. 2 only show schematic cross-sectional views, it may be understood that the carrier 104 may surround the die 102 from all sides. For example, the carrier 104 may include a through-hole 222 (see FIG. 2) in which the die 102 is arranged. The insulating material 110 may be arranged between the die 102 and the carrier 110. The insulating material 110 may in various embodiments fulfill an additional function of fixing the die 102 to the carrier 104. The insulating material 110 may for example be an adhesive and/or may be shaped in such a way that the die 102 is held in place.

The carrier 104 may have a plurality of through-holes 222, such that a plurality of dies 102 may be arranged in the through-holes 222, one die 102 per through-hole 222. This may serve as a basis for a plurality of die packages 100, which may be identical to or different from each other. In other words, a multi-die-package (shown in FIG. 2) including a plurality of die packages 100 may be formed, which may be singulated into a plurality of individual die packages 100 during a later process, as will be described in context with FIG. 2.

In various embodiments, the die package 100 may include a metal connection structure 112 electrically connecting the metal structure 106 and the second pad contact 108P2. In other words, the metal connection structure 112 may include or consist of metal, and may be in direct contact with the metal structure 106 and with the second pad contact 108P2. In the schematic cross-sectional view of FIG. 1 showing the die package 100a, two dashed lines indicate a contact region between the metal structure 106 and the metal connection structure 112. In the die packages 100b and 100c, no corresponding lines are added, but the contact region would be in a similar location.

The metal connection structure 112 may in various embodiments include or consist of the same material as the metal structure 106 and/or as the second chip contact 102C2.

The metal connection structure 112 may in various embodiments be part of the carrier 104.

The carrier 104 may for example include an electrically insulating bulk material, and the metal connection structure 112 may extend through and/or along the electrically insulating bulk material. For example, the insulating bulk material may include or consist of a printed circuit board (PCB), e.g. a PCB laminate, a flame retardant (FR) material (e.g., FR4), a composite epoxy material (CEM), such as CEM1 or CEM3, a Bismaleimide-Triazine resin (BT) material, imide, polyimide, ABF, or made of a combination of the aforementioned exemplary materials. The insulating bulk material may for example be formed as a monolithic structure, or as a multi-layered structure.

The metal connection structure 112 may for example be arranged along (e.g. all) inner side walls of the through-hole 222, and may extend at least partially to main surfaces of the carrier 104. Such an embodiment of a die package 100a is shown in FIG. 1 at the top, with the carrier 104, 104a having the metal connection structure 112 formed on inner side walls of the through hole 222, and on both main surfaces (i.e., on a first side S1 of the carrier 104, 104a and on a second side S2 of the carrier 104, 104a) in connection with the portion formed on the inner side walls of the through hole 222. The metal connection structure 112 may for example be formed as a metal layer. A thickness of the metal layer may be in a range from about 5 μm to about 30 μm, e.g. from about 10 μm to about 20 μm, e.g. around 15 μm. The metal layer may have a thickness of at least 10 μm, e.g. between 10 μm and 100 μm. In that case, the metal layer may be able to conduct a current having approximately 20 to 30 amperes. For larger currents, plated through holes filled with metal (see FIG. 1, middle) or a carrier 104, 104b consisting or essentially consisting of metal, e.g. a leadframe (see FIG. 1, bottom), may be used. If only smaller currents are foreseen, the metal layer with the thickness below 10 μm and/or plated vias or micro-vias through the carrier 104 (not shown) may be used as the metal connection structure 112.

In various embodiments, as shown in FIG. 1, middle, for the exemplary die package 104b, the metal connection structure 112 may be a metal block, e.g. a copper block, extending completely through the insulating bulk material from a first side S1 of the carrier 104 to a second side S2 of the carrier 104 opposite the first side S1 of the carrier 104. The carrier 104, 104a may be or include a PCB, for example.

In various embodiments, the carrier 104, 104b may include a metal bulk material, wherein the metal bulk material may form a metal connection structure 112 providing an electrical connection between the second die contact 102C2 and the metal structure 106. The metal bulk material may be the same as the material of the metal structure 106, e.g. copper, an aluminum-copper-alloy, a nickel-copper-alloy, or copper plated aluminum.

The metal structure 106 may in various embodiments extend laterally to the carrier 104 for contacting the metal connection structure 112. In other words, the metal structure 106 may overlap the carrier 104 at least far enough for directly contacting the metal connection structure 112.

In the embodiments shown in FIG. 1, the metal structure 106 extends (laterally) completely over the die 102, over the insulating material 110, and over a large fraction of the carrier 104. In particular, the metal structure 106 extends over the complete die backside metallization 102C2, which may typically be structured and approximately 20 to 100 μm smaller than a semiconductor (e.g. silicon) bulk material of the die 102 (a dicing process used for dicing a semiconductor wafer into individual dies 102 is easier if only the semiconductor material is diced, hence the metal structure is typically not formed or removed in the dicing areas).

In the die package 100a illustrated in FIG. 1A, with the metal connection structure 112 only arranged on an outside of the insulating bulk material of the carrier 104, 104a, the metal structure 106 is in direct contact with a portion of the metal connection structure 112 that is arranged on one of the main surfaces of the carrier 104 and that has a surface that is in the same plane as the main surface of the second die contact 102C2.

In the die package 100b illustrated in FIG. 1B, with the metal connection structure 112 extending through and being arranged on an outside of the insulating bulk material of the carrier 104, 104a, the metal structure 106 is in direct contact with a portion of the metal connection structure 112 that is arranged on one of the main surfaces of the carrier 104 and that has a surface that is in the same plane as the main surface of the second die contact 102C2.

In the die package 100c illustrated in FIG. 1C, with the metal bulk material of the carrier 104, 104b forming the metal connection structure 112, the metal structure 106 is in direct contact with the carrier 104, 104b. An outer surface of the carrier 104, 104b is in the same plane as the main surface of the second die contact 102C2.

In FIG. 2 (including FIGS. 2A, 2B, 2C, 2D, 2E, 2F and 2G), a process 200 of forming a die package 100 in accordance with various embodiments is shown. Considering the carrier 104, 104a used, it is the die package 100, 100a that is formed in FIG. 2. However, the processes applied are the same or essentially the same for the die packages 100a, 100b and 100c, only the carrier 104 (and, respectively, a pre-processing of the carrier 104, if applicable) may differ for the different embodiments. As a consequence, when referring to, e.g., the metal connection structure 112 of FIG. 2, only the reference number 112 is used. But it is to be understood that the described process applies generally also to embodiments in which a different carrier, e.g. as shown in FIG. 1, is used, and hence the metal connection structure 112 includes also the plated through-hole 116, or is formed by the metal carrier 104b.

The die 102 that may be included in the die package 100, 100b may have a first die contact 102C1 on a first side S1 of the die 102 and a second die contact 102C2 on a second side S2 of the die 102 opposite the first side S1 of the die 102.

The process flow is very simple and it starts with manufacturing the carrier 104 (also referred to as core layer) in which the die 102 will be embedded. In various embodiments, the method may include providing the carrier 104 having at least one through-hole 222, for example a plurality of through-holes 222.

Figure 2A:
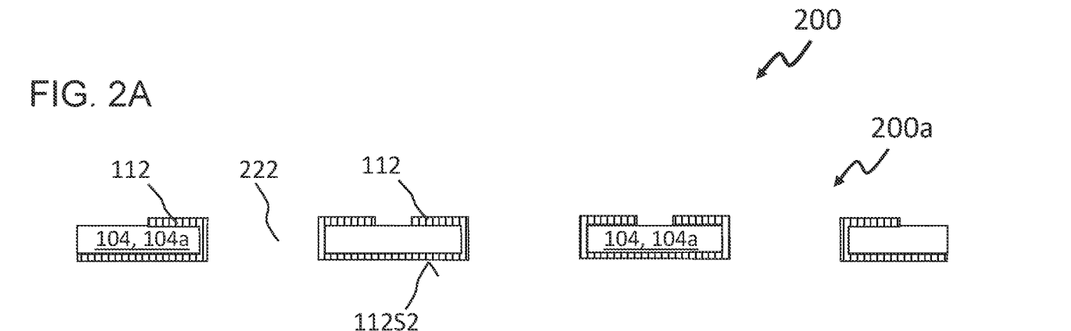
FIGS. 2A, 2B, 2C, 2D, 2E, 2F and 2G, illustrates a visualization of a process of forming a die package in accordance with various embodiments.
Figure 3:
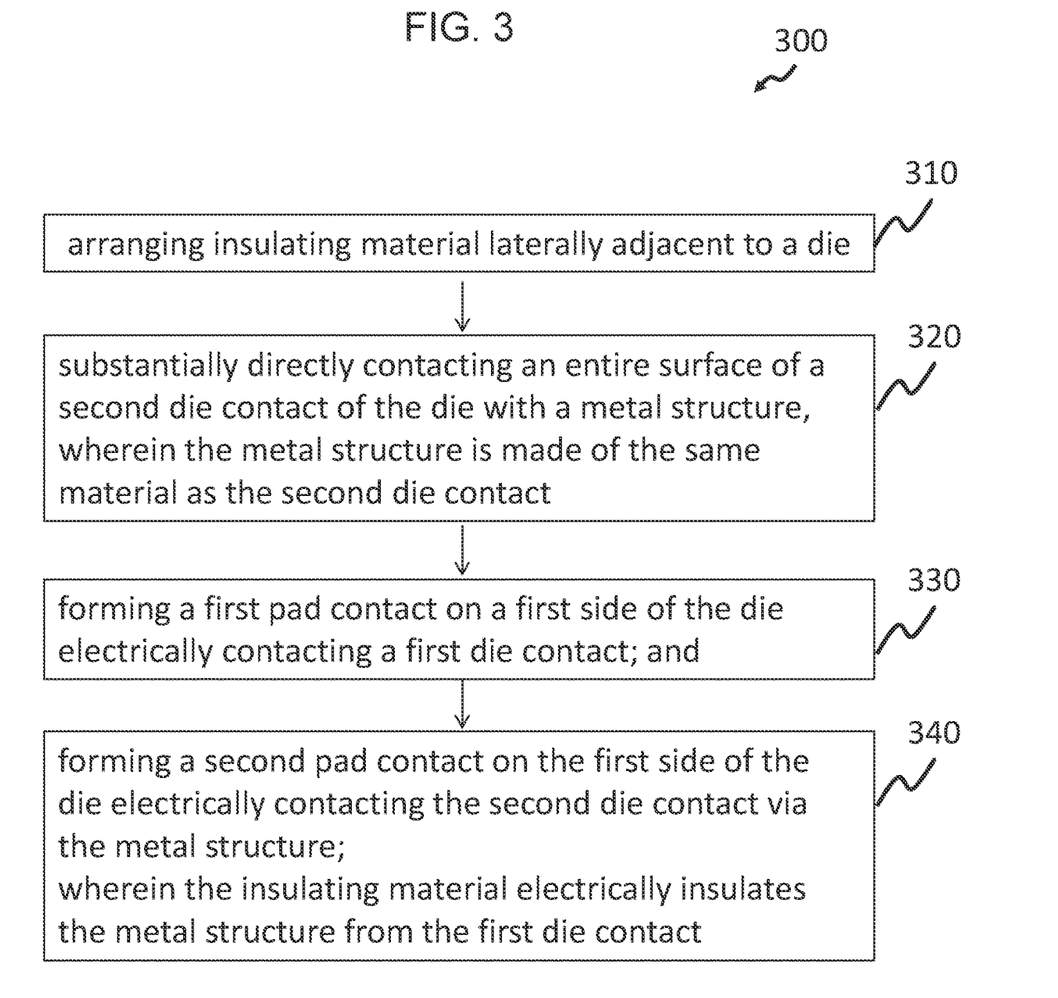
FIG. 3 illustrates a flow diagram of a method of forming a die package.

The carrier 104, 104a shown in panel 200a of FIG. 2A may be an insulating carrier 104, 104a having a metal layer forming a metal connection structure 112 arranged on its outside, as described in context with FIG. 1 (top). The carrier 104 may for example be a simple two-sided PCB board. As an alternative to the carrier 104a, an insulating carrier 104a that has a metal connection structure 112 extending from one main surface of the carrier 104a to an opposite main surface of the carrier 104a through the carrier 104a, e.g. as described above in context with FIG. 1 (middle) may be used, or a carrier 104b consisting or essentially consisting of metal, e.g. a copper leadframe of structured Cu sheet/foil, thus with the whole carrier 104b forming the metal connection structure 104b, 112, e.g. as described above in context with FIG. 1 (bottom). In various embodiments, combinations or variations of the above described carriers 104 may be used.

The carrier 104, irrespective of the type of carrier 104, may be provided with openings or cavities 222 for the dies 102. Since it may be important that the opening(s) extend all the way through the carrier 104, such that the first die contact 102C1 is exposed on the first side S1 of the carrier 104, and the second die contact 102C2 is exposed on the second side S2 of the carrier 104, the openings/cavities 222 may be referred to as through-holes 222.

Connections, i.e. the metal connection structure 112 from the first (in FIG. 2A top) side S1 of the carrier 104, e.g. the two-sided PCB board 104a) to the second (in FIG. 2A bottom) side S2 may for example be manufactured as plated through holes, plated through-hole (cavity) edges, or plated slots for example.

The plurality of through-holes 222 may be arranged in the carrier 104 as a linear or two-dimensional array of through-holes 222, for example in a matrix-like fashion. In panel 200a of FIG. 2A, a cross-sectional schematic view of a carrier 104 having the plurality of through-holes 222 is shown. A shape of the at least one through-hole 222 in a horizontal plane of the carrier 104 may be rectangular, e.g. quadratic, ellipsoidal, e.g. round, or any other suitable shape. For example, the shape of the at least one through-hole 222 may be adjusted to the die 102 to be arranged inside the through-hole 222, for example in such a way that the through-hole 222 is larger than a horizontal two-dimensional size of the die 102. For example in such a way that a distance between side walls of the carrier 104 in the through-hole 222 and the die 102 arranged in the through-hole 222 is constant or essentially constant for all the side walls. The size of the through-hole 222 may for example be configured to allow a distance between each die side wall and its opposite through-hole side wall to be for example in a range from about 5 µm to about 500 µm, e.g. from about 10 µm to about 100 µm.

Figure 2B:
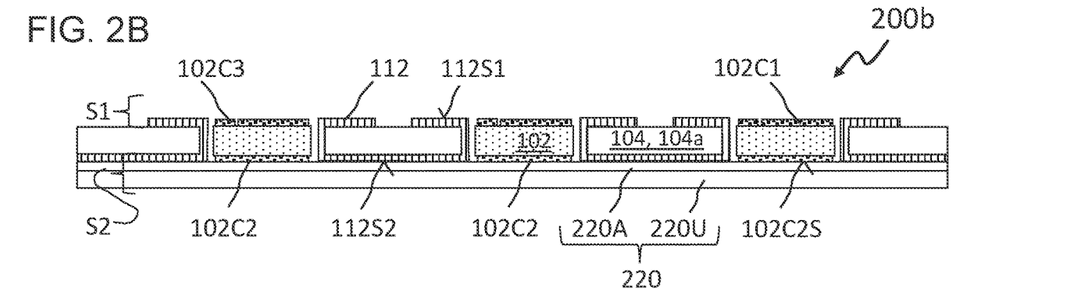

In various embodiments, as shown in panel 200b, the method may further include arranging at least one die 102 in the at least one through-hole 222. In other words, the at least one die 102 may be arranged in the through-hole 222 of the carrier 104 in such a way that the carrier 104 laterally surrounds the die 102.

In various embodiments, one die 102 may be arranged in each through-hole 222, i.e. one die 102 in one through-hole 222, or a plurality of dies 102 in a plurality of through-holes 222, with one die 102 per through-hole 222. In various embodiments, more than one die 102 may be arranged per through-hole 222, for example two dies 102 may be arranged in a single through-hole 222, both with the second die contact 102C2 facing the same side S2.

As further shown in FIG. 2B, panel 200b, before the arranging the die 102 in the through-hole 222, the carrier 104 may be arranged on a temporary carrier 220. The temporary carrier 220 may for example include a supporting layer 220U and an adhesive layer 220A. The carrier 104 may be placed on the temporary carrier 220 in contact with the adhesive layer 220A, e.g. an adhesive tape. The carrier 104 may be placed on the temporary carrier 220 in such a way that a metal surface 112S2 of the metal connection structure 112, which is part of or formed by the carrier 104, is in direct contact with the temporary carrier 220.

The at least one die 102 may be placed inside the through-hole(s) (e.g. as described above) on the temporary carrier 220. The die 102 may be placed on the temporary carrier 220 with the second die contact 102C2 contacting the temporary carrier 220 (for example the adhesive layer 220A of the temporary carrier 220). For a precise positioning, aligning marks on the temporary carrier 220 may be used.

By placing both the carrier 104 with its metal surface 112S2 and the die 102 with its second die contact 102C2 on the temporary carrier 220, it may be ensured that, after a removal of the temporary carrier 220 (to be described below) the metal surface 112S2 and a metal surface of the second die contact 102C2 are at the same level (i.e., form a common plane), and that the insulating material arranged laterally adjacent to the die 102, e.g. between the die 102 and the carrier 104, may neither extend to the metal surface 112S2 of the metal structure 112 nor to the surface of the second die contact 102C2, which may be beneficial for the arranging of the metal structure 106.

The method may further include, after the die 102 placement, arranging insulating material 110 laterally adjacent to the die 102. An example of this is shown in panel 200c of FIG. 2C. The insulating material 110 may for example be arranged laterally around the die 102 on all sides. The insulating material 110 may for example be arranged between the die 102 and the carrier 104, e.g. laterally on all sides of the die 102.

Figure 2C:
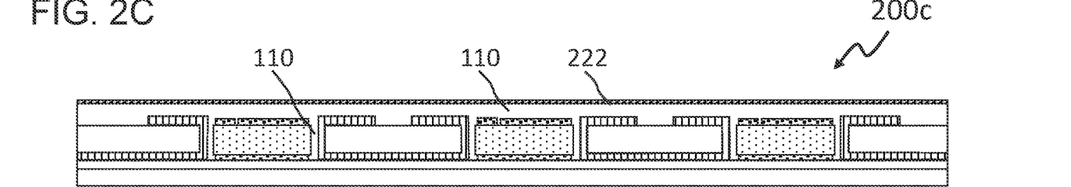
Figure 2D:
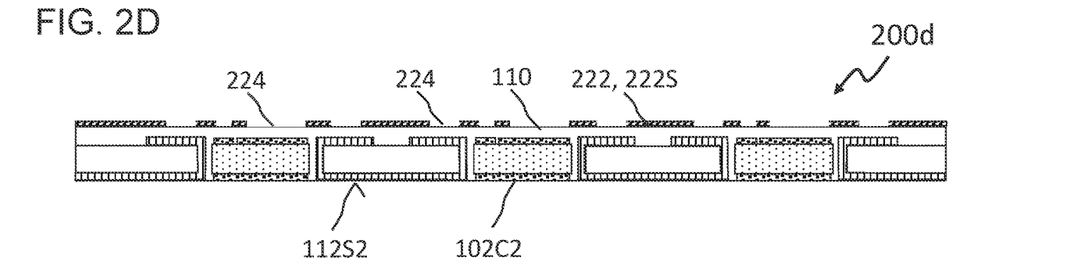
Figure 2E:
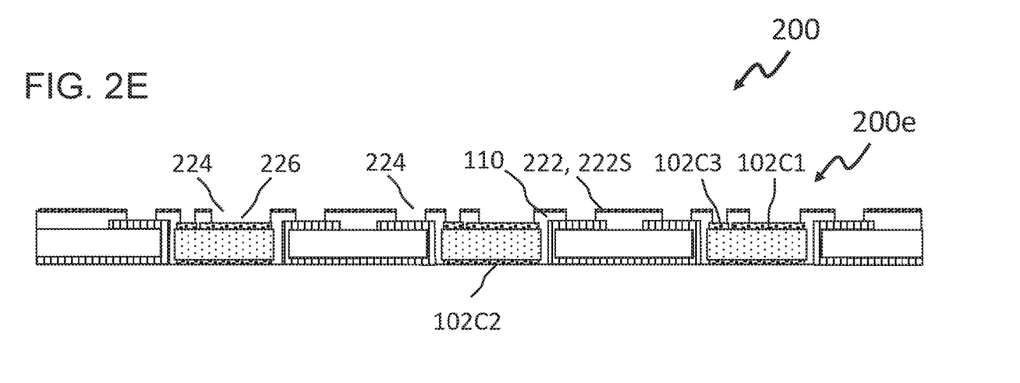

In the embodiment shown in panel 200c of FIG. 2C, the insulating material 110 may be arranged by laminating a resin foil (with the resin forming the insulating material 110) with a Cu seed layer 222 on to the first side S1 (the top side) of the die(s) 102 and of the carrier 104. The resin foil can for example be ABF (or a similar type of foil e.g. from Hitachi), or other resin foils with or without filler particles or reinforcement, or for example resin coated copper (RCC) foil. During the laminating, the insulating material (e.g. the resin) may be pressed around the die 102, e.g. into the space between the die 102 and the carrier 104.

Instead of lamination, the insulating material 110, e.g. the resin, may for example be printed, molded, etc., and the seed layer 222 may for example be sputtered (e.g. using a process that is typically used for an embedded wafer level ball grid array (eWLB)) or formed by an electroless plating process. The seed layer 222 may also be referred to as a further metal layer 222.

In various embodiments, for example as shown in panel 200c of FIG. 2C, the insulating material 110 may not only be arranged laterally adjacent to the die 102, but also on the first side S1 of the die 102 and also on the first side S1 of the carrier 104, in such a way that the first die contact 102C1 is electrically insulated from the third die contact 102C3, and both are electrically insulated from the metal connection structure 112.

In various embodiments, the seed layer 222 may be structured, thereby forming a structured seed layer 222S. This is shown in panel 200d of FIG. 2D. For the example lithography and etching may be used to remove structuring, for the seed layer 222, e.g. the copper, from the areas 224 where the contact pads 108P to the die 102 may be manufactured. This may be areas 224 over the first die contact 102C1 and, if present, over the third die contact 102C3, and also areas 224 over the metal surface 112S1 of the metal connection structure 112 of the carrier 104, through which the second die contact 102C2 may be contacted.

On the second side S2, the temporary carrier 220 may be removed, for example by exposing the temporary carrier 220 to UV radiation, and/or by heating the temporary carrier 220, or by other suitable means. Thereby, the second die contact 102C2 and a second surface 112S2 of the metal connection structure 112 may be exposed, as is also shown in panel 200*d* of FIG. 2D.

After the structuring of the seed layer 222 to form the structured seed layer 222S, the opening, i.e. the exposing of the first (and respectively the third) die contact 102C1, 102C3 may be done by removing the insulating material 110 in regions 226 below the areas 224. This is shown in panel 200*e* of FIG. 2E. For this process, for example plasma processing, water blasting or laser processing may be used, for example by using the structured seed layer 222S, e.g. the structured copper seed layer, as a mask. In various embodiments, the structuring of the seed layer 222 may be skipped, and the die contacts 102C1, 102C3 may for example be laser-drilled directly. In various embodiments, the forming of the seed layer 222 may be skipped (or moved to a later stage). In that case, for example, a mask, e.g. a metal mask, may be used in combination with a plasma process to remove the insulating material 110. The seed layer 222 and/or an electroless plating layer 108P may be added thereafter. In case a photodefinable resin system (e.g. by Hitachi) is used, as an alternative, a photolithography process and development process may be used.

After the opening process, two metal layers 228S1, 228S2 (together referred to as the metal layers 228; they may for example consisting of or include copper (Cu), or, more generally, the same metal that is included in the second die contact 102S2, or, if that is a layered structure, the metal exposed on the surface of the second die contact 102S2) may be formed, one on each side, S1 and S2, respectively, of the carrier-die-combination. For this, a sputtering process or an electroless process and/or an electrochemical process, e.g. plating, may be used. Typically, a combination of sputtering and an electrochemical process or a combination of an electroless process and an electrochemical process may be used. The process is shown in panel 200*f* of FIG. 2F. In case the electrochemical process is used, the (e.g. copper) seed layer 222 may be used as the seed layer for the electrochemical plating process on the first side S1.

Figure 2F:
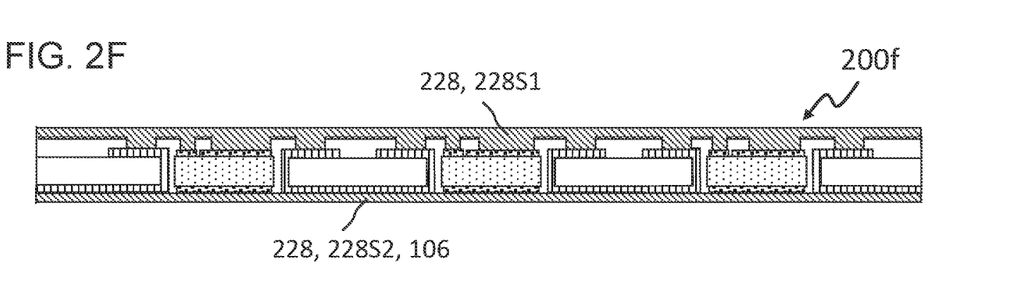

The bottom metal layer 228S2 may be a metal structure 106 that substantially directly contacts the entire surface of the second die contact 102C2 of the die 102. The metal layer 228S2 (and hence the metal structure 106) may laterally extend to the carrier 104 to contact the metal connection structure 112, thereby forming an electrically conductive connection between the second die contact 102C2 and the metal connection structure 112, and thus to the first (front) side S1 of the carrier-die-combination.

The top metal layer 228S1 may form the first pad contact 108P1 on the first side S1 of the die 102 electrically contacting the first die contact 102C1. If the third die contact 102C3 is present, the top metal layer 228S1 may also form the third pad contact 108P3 on the first side S1 of the die 102 electrically contacting the third die contact 102C3. Furthermore, the top metal layer 228S1 may form the second pad contact 108P2 on the first side S1 of the die 102, which may electrically contact the second die contact 102C2 via the metal structure 106 (and via the metal connection structure 112).

With the first pad contact 108S1 and the second pad contact 108S2 arranged on the same side S1, the first pad contact 108S1 and the second pad contact 108S2 (and, if present, also the third pad contact 108S3) may be formed in a common process. Using the plating process (or any process that acts on the top and the bottom side at the same time), the top metal layer 228S1 forming the pad contacts 108S1, 108S2, 108S3 and the bottom metal layer 228S2 forming the metal structure 106 may be formed in a common process.

Figure 2G:
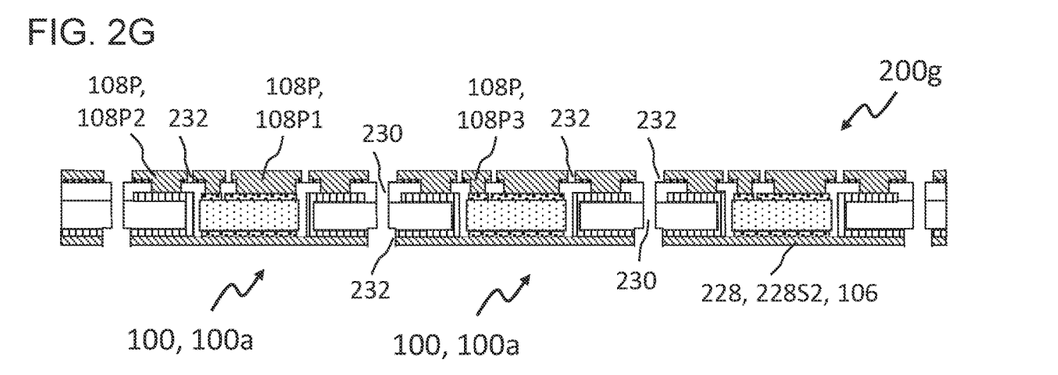

In various embodiments, as shown in panel 200*g* of FIG. 2G, the metal layers 228S1, 228S2 may be structured for electrically insulating the metal structure 106 from the first die contact 102C1 and from the third die contact 102C3, and for insulating the first die contact 102C1 from the third die contact 102C3, or, generally speaking, for electrically insulating the die contacts 102C1 and 102C2 (and, if present, 102C3) from each other. For this, their respective contact pads 108, i.e. the first contact pad 108P1 and the second contact pad 108P2 (and, if present, the third contact pad 108P3) may be electrically insulated from each other. The electrical insulation may be achieved by forming openings 232 in the top metal layer 228S1 that extend all the way down to the insulating material 110. In the horizontal plane, the openings 232 may form a closed ring (not necessarily round; they may have any shape that closes on itself, like a closed ring-shaped rectangular opening) or may connect two positions on an edge of the metal layer 228S1, or may have any other shape that allows to electrically insulate the contact pads 108P1, 108P2, 108P3 from each other.

Openings 232 may furthermore be arranged at positions on the top (first) side S1 and on the bottom (second) side S2 that are foreseen for a separating (e.g. dicing) of the carrier-die-combination, which forms a multi-package, into a plurality of individual die packages 100*a*. For the structuring, common processes like photolithographic and etching processes may be used. For example, in a case of the plating being performed as a pattern plating process, i.e. plating inside a photomask, the seed layer 222 that may be present in the dicing area (also referred to as dicing street or kerf region) and/or between the contact pads may be removed by etching. For the dicing, common processes like sawing or laser processing may be used.

In various embodiments, a manufacturing process and a structure to manufacture simplified low cost and high performance laminate based power packages is provided.

FIG. 3 shows a flow diagram 300 of a method of forming a die package. The die package may include a die having a first die contact on a first side of the die and a second die contact on a second side of the die opposite the first side of the die. The method may include arranging insulating material laterally adjacent to the die (in 310), substantially directly contacting the entire surface of the second die contact of the die with a metal structure, wherein the metal structure is made of the same material as the second die contact (in 320), forming a first pad contact on the first side of the die electrically contacting the first die contact (in 330), and forming a second pad contact on the first side of the die electrically contacting the second die contact via the metal structure, wherein the insulating material electrically insulates the metal structure from the first die contact (in 340).

Various examples will be illustrated in the following:

Example 1 is a die package. The die package may include a die having a first die contact on a first side of the die and a second die contact on a second side of the die opposite the first side of the die, insulating material laterally adjacent to the die, a metal structure substantially directly contacting the entire surface of the second die contact of the die, wherein the metal structure is made of the same material as the second die contact, a first pad contact on the first side of the die electrically contacting the first die contact, and a second pad contact on the first side of the die electrically contacting the second die contact via the metal structure, wherein the insulating material electrically insulates the metal structure from the first die contact.

Example 2 is a die package. The die package may include a die having a first die contact on a first side of the die and a second die contact on a second side of the die opposite the first side of the die, insulating material laterally adjacent to the die, a metal structure substantially directly contacting the surface of the second die contact of the die, wherein the surface of the second die contact is free from insulating material, and wherein the metal structure is made of the same material as the first die contact, a first pad contact on the first side of the die electrically contacting the first die contact, and a second pad contact on the first side of the die electrically contacting the second die contact via the metal structure, wherein the insulating material electrically insulates the metal structure from the first die contact.

In Example 3, the subject-matter of Example 1 or 2 may optionally further include a carrier laterally surrounding the die.

In Example 4, the subject matter of Example 3 may further include that the carrier includes a through-hole in which the die is arranged.

In Example 5, the subject-matter of Example 3 or 4 may optionally include that the metal structure laterally extends to the carrier.

In Example 6, the subject-matter of any of Examples 3 to 5 may optionally include that the carrier includes an electrically insulating bulk material and a metal connection structure extending through and/or along the electrically insulating bulk material, wherein the metal connection structure provides an electrical connection between the second die contact and the metal structure.

In Example 7, the subject matter of Example 6 may optionally include that the carrier is a printed circuit board.

In Example 8, the subject matter of Example 4 and 6 may optionally include that the metal connection structure is formed on at least one inner side wall of the through-hole.

In Example 9, the subject matter of Example 8 may optionally include that the metal connection structure is formed on all inner side walls of the through-hole.

In Example 10, the subject matter of Example 8 or 9 may optionally include that the metal connection structure has a thickness of at least 10 µm, optionally between 10 µm and 100 µm.

In Example 11, the subject matter of Example 6 or 7 may optionally include that the metal connection structure is a via, optionally a micro-via.

In Example 12, the subject matter of Example 6 or 7 may optionally include that the metal connection structure is a metal block extending completely through the insulating bulk material from a first side of the carrier to a second side of the carrier opposite the first side of the carrier.

In Example 13, the subject matter of any of Examples 6 to 12 may optionally include that the metal connection structure is made of the same material as the metal structure.

In Example 14, the subject-matter of any of Examples 3 to 5 may optionally include that the carrier includes a metal bulk material, wherein the metal bulk material forms a metal connection structure providing an electrical connection between the second die contact and the metal structure.

In Example 15, the subject matter of Example 13 may optionally include that the carrier is a lead frame.

In Example 16, the subject matter of Example 14 or 15 may optionally include that the metal bulk material is the same as the material of the metal structure.

In Example 17, the subject matter of any of the preceding Examples may optionally include that the die forms a diode, wherein the first die contact is an anode of the diode and the second die contact is a cathode of the diode, or vice versa.

In Example 18, the subject matter of any of the preceding Examples may optionally include a third die contact on the first side of the die, and a third pad contact on the first side of the die electrically contacting the third die contact, wherein the insulating material electrically insulates the metal structure from the third die contact.

In Example 19, the subject matter of Example 18 may optionally further include further insulating material insulating the first pad contact from the third pad contact.

In Example 20, the subject matter of Example 18 or 19 may optionally include that the die forms a transistor, wherein the third die contact is a controlling terminal of the transistor; and wherein the first die contact and the second die contact are controlled terminals of the transistor.

In Example 21, the subject matter of any of the previous Examples may optionally include that the material of the metal structure and of the second die contact is at least one of a group of materials, the group consisting of: copper, an aluminum-copper-alloy, a nickel-copper-alloy, and copper plated aluminum.

In Example 22, the subject matter any of Examples 18 to 21 may optionally include that the third die contact and the third contact pad are made of same material as the second die contact and the metal structure.

In Example 23, the subject matter of any of the previous Examples may optionally include that the die package is a power semiconductor device.

Example 24 is a method of forming a die package. The die package may include a die having a first die contact on a first side of the die and a second die contact on a second side of the die opposite the first side of the die, and the method may include arranging insulating material laterally adjacent to the die, substantially directly contacting the entire surface of the second die contact of the die with a metal structure, wherein the metal structure is made of the same material as the second die contact, forming a first pad contact on the first side of the die electrically contacting the first die contact, and forming a second pad contact on the first side of the die electrically contacting the second die contact via the metal structure, wherein the insulating material electrically insulates the metal structure from the first die contact.

In Example 25, the subject matter of Example 24 may optionally further include, before the arranging of the insulating material, arranging a carrier having a through-hole such that it laterally surrounds the die.

In Example 26, the subject matter of Example 25 may optionally further include arranging the die on a temporary carrier, wherein the die is placed on the temporary carrier with the second die contact contacting the temporary carrier, wherein the arranging the carrier includes arranging the carrier on the temporary carrier, wherein the carrier is placed on the temporary carrier with a metal surface of the carrier contacting the temporary carrier.

In Example 27, the subject matter of Example 26 may optionally further include, before the substantially directly contacting the entire surface of the second die contact of the die with a metal structure, removing the temporary carrier, wherein the substantially directly contacting the entire surface of the second die contact of the die with a metal structure includes forming a metal layer on the second die contact, wherein the metal layer laterally extends to the carrier.

In Example 28, the subject matter of Example 27 may optionally include that the forming the metal layer includes electroless or electrochemical plating.

In Example 29, the subject matter of Example 27 or 28 may optionally include that the first pad contact and the second pad contact include metal, and that the forming the metal layer and an arranging of the metal for the forming of the first pad contact and the forming of the second pad contact are performed in a common process.

In Example 30, the subject matter of any of Examples 24 to 29 may optionally include that the arranging the insulating material laterally adjacent to the die includes laminating, printing or molding the insulating material.

In Example 31, the subject matter of any of Examples 24 to 30 may optionally further include arranging a further metal layer over the insulating material.

In Example 32, the subject matter of Example 31 may optionally include that the arranging the further metal layer over the insulating material includes sputtering.

In Example 33, the subject matter of Examples 30 and 31 may optionally include that the insulating material and the further metal layer are arranged in a common process of laminating a foil including the insulating material and the further metal layer onto the die, such that the insulating material is arranged laterally adjacent to the die.

In Example 34, the subject matter of any of Examples 30 to 33 may optionally include that the metal of the metal foil forms a seed layer for a plating process for the forming the first pad contact and the forming the second pad contact.

In Example 35, the subject matter of Example 26 in combination with any of Examples 31 to 34 may optionally include at least partially removing the further metal layer and the insulating material over the first die contact and over the metal surface of the carrier, such that the first die contact and the metal surface of the carrier, respectively, are at least partially exposed.

In Example 36, the subject matter of Example 35 may optionally include that the at least partially removing the further metal layer includes photolithographic structuring.

In Example 37, the subject matter of Example 35 or 36 may optionally include that the at least partially removing the insulating material includes laser or plasma structuring and/or water blasting using the further metal layer as a mask.

In Example 38, the subject matter of any of Examples 24 to 37 may optionally include that the forming the first contact pad and the forming the second contact pad include photolithographic structuring.

In Example 38, the subject matter of any of Examples 24 to 37 may optionally include that the carrier and the die are part of a multi-package, the multi-package including a plurality of integrally formed die packages, the method further including separating the plurality of integrally formed die packages into a plurality of individual die packages.

In Example 39, the subject matter of Example 38 may optionally include that the separating includes dicing.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A die package, comprising:
   a die having a first die contact on a first side of the die and a second die contact on a second side of the die opposite the first side of the die;
   insulating material laterally adjacent to the die;
   a metal structure and wherein an outer surface of the metal structure facing away from the second die contact on the second side of the die is exposed;
   a first pad contact on the first side of the die electrically contacting the first die contact;
   a second pad contact on the first side of the die electrically contacting the second die contact via the metal structure, the first pad contact and second pad contact exposed at an exterior of the die package; and
   a carrier laterally surrounding the die;
   wherein the insulating material is in direct contact with the metal structure and with the first die contact and electrically insulates the metal structure from the first die contact.

2. The die package of claim 1, the metal structure directly contacting the second die contact at outer edges of the second die contact.

3. The die package of claim 2, the metal structure directly contacting an entire surface of the second die contact.

4. The die package of claim 1, wherein the metal structure is made of the same material as the second die contact.

5. The die package of claim 1,
   wherein the metal structure laterally extends to the carrier.

6. The die package of claim 1,
   wherein the carrier comprises an electrically insulating bulk material, a portion of the metal structure extending through and/or along the electrically insulating bulk material.

7. A die package, comprising:
   a die having a first die contact on a first side of the die and a second die contact on a second side of the die opposite the first side of the die;
   insulating material laterally adjacent to the die;
   a metal structure;
   a first pad contact on the first side of the die electrically contacting the first die contact;
   a second pad contact on the first side of the die electrically contacting the second die contact via the metal structure; and
   a carrier laterally surrounding the die;
   wherein the insulating material is in direct contact with the metal structure and with the first die contact and electrically insulates the metal structure from the first die contact;
   wherein the carrier comprises a metal bulk material and forms a portion of the metal structure; and
   wherein the first pad contact and the second pad contact are exposed at an exterior of the die package.

8. The die package of claim 7, the metal structure directly contacting an entire surface of the second die contact.

9. The die package of claim 7, wherein the metal structure is made of the same material as the second die contact.

10. The die package of claim 7,
    wherein the die forms a diode; and
    wherein the first die contact is an anode of the diode and the second die contact is a cathode of the diode, or vice versa.

11. The die package of claim 7, further comprising:
    a third die contact on the first side of the die; and
    a third pad contact on the first side of the die electrically contacting the third die contact;
    wherein the insulating material electrically insulates the metal structure from the third die contact.

12. The die package of claim 7,
    wherein the die forms a transistor;
    wherein the third die contact is a controlling terminal of the transistor; and wherein the first die contact and the second die contact are controlled terminals of the transistor.

13. The die package of claim 7, wherein the die package is a power semiconductor device.

14. A method of forming a die package comprising a die having a first die contact on a first side of the die and a second die contact on a second side of the die opposite the first side of the die; the method comprising:
arranging insulating material laterally adjacent to the die;
before the arranging of the insulating material, arranging a carrier having a through-hole such that it laterally surrounds the die;
contacting the surface of the second die contact of the die with a metal structure;
forming a first pad contact on the first side of the die electrically contacting the first die contact; and
forming a second pad contact on the first side of the die electrically contacting the second die contact via the metal structure;
wherein the insulating material directly contacts the metal structure and the first die contact and electrically insulates the metal structure from the first die contact; and
arranging the die on a temporary carrier, wherein the die is placed on the temporary carrier with the second die contact contacting the temporary carrier;
wherein the arranging the carrier comprises:
arranging the carrier on the temporary carrier, including placing the carrier on the temporary carrier with a metal surface of the carrier contacting the temporary carrier.

15. The method of claim 14, further comprising:
removing the carrier, then substantially directly contacting the entire surface of the second die contact of the die with a metal structure;
wherein the substantially directly contacting the entire surface of the second die contact of the die with a metal structure comprises forming a metal layer on the second die contact, wherein the metal layer laterally extends to the carrier.

16. The method of claim 14, comprising:
forming the metal structure of the same material as the second die contact.

17. The method of claim 14, wherein the arranging the insulating material laterally adjacent to the die comprises laminating, printing or molding the insulating material.

18. A method of forming a die package comprising a die having a first die contact on a first side of the die and a second die contact on a second side of the die opposite the first side of the die; the method comprising:
arranging insulating material laterally adjacent to the die;
before the arranging of the insulating material, arranging a carrier having a through-hole such that it laterally surrounds the die;
contacting the surface of the second die contact of the die with a metal structure;
forming a first pad contact on the first side of the die electrically contacting the first die contact; and
forming a second pad contact on the first side of the die electrically contacting the second die contact via the metal structure;
wherein the insulating material electrically insulates the metal structure from the first die contact; and
arranging the die on a temporary carrier, wherein the die is placed on the temporary carrier with the second die contact contacting the temporary carrier;
wherein the arranging the carrier comprises:
arranging the carrier on the temporary carrier, including placing the carrier on the temporary carrier with a metal surface of the carrier contacting the temporary carrier; and
wherein the first pad contact and the second pad contact include metal, and wherein the forming the metal structure and an arranging of the metal for the forming of the first pad contact and the forming of the second pad contact are performed in a common process.

19. A method of forming a die package comprising a die having a first die contact on a first side of the die and a second die contact on a second side of the die opposite the first side of the die; the method comprising:
arranging the die within a through-hole in a carrier;
arranging insulating material laterally adjacent to the die;
contacting the surface of the second die contact of the die with a metal structure;
forming a first pad contact on the first side of the die electrically contacting the first die contact;
forming a second pad contact on the first side of the die electrically contacting the second die contact via the metal structure; and
arranging a further metal layer over the insulating material;
wherein the insulating material contacts the metal structure and the first die contact and electrically insulates the metal structure from the first die contact, and wherein the insulating material and the further metal layer are arranged in a common process of laminating a foil comprising the insulating material and the further metal layer onto the die, such that the insulating material is arranged laterally adjacent to the die.

20. The method of claim 19, wherein the metal of the metal foil forms a seed layer for a plating process for the forming the first pad contact and the forming the second pad contact.

21. The method of claim 19, wherein the carrier and the die are part of a multi-package, the multi-package comprising a plurality of integrally formed die packages, the method further comprising:
separating the plurality of integrally formed die packages into a plurality of individual die packages.

22. The method of claim 19, comprising:
fixing the die to the carrier laterally with the insulating material.

23. The method of claim 19, comprising:
directly contacting outer edges of the second die contract with the metal structure.

24. The method of claim 19, comprising:
directly contacting the entire surface of the second die contact of the die with the metal structure.

* * * * *